(12) United States Patent
Elian et al.

(10) Patent No.: US 10,107,875 B2
(45) Date of Patent: Oct. 23, 2018

(54) GMR SENSOR WITHIN MOLDED MAGNETIC MATERIAL EMPLOYING NON-MAGNETIC SPACER

(75) Inventors: Klaus Elian, Alteglofsheim (DE); Martin Petz, Hohenkammer (DE); Uwe Schindler, Reichenbach (DE); Horst Theuss, Wenzenbach (DE); Adolf Koller, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 1452 days.

(21) Appl. No.: 12/627,848

(22) Filed: Nov. 30, 2009

(65) Prior Publication Data

US 2011/0127998 A1 Jun. 2, 2011

(51) Int. Cl.

| | |
|---|---|
| *G01R 33/09* | (2006.01) |
| *B82Y 25/00* | (2011.01) |
| *G01D 5/244* | (2006.01) |
| *G01P 1/02* | (2006.01) |
| *G01P 3/488* | (2006.01) |
| *H01L 43/02* | (2006.01) |

(52) U.S. Cl.
CPC ............ *G01R 33/093* (2013.01); *B82Y 25/00* (2013.01); *G01D 5/24438* (2013.01); *G01P 1/026* (2013.01); *G01P 3/488* (2013.01); *H01L 43/02* (2013.01); *H01L 2224/32245* (2013.01); *H01L 2224/48091* (2013.01); *H01L 2224/48257* (2013.01); *H01L 2224/73265* (2013.01)

(58) Field of Classification Search
CPC .............. B29C 45/14639; G01R 33/09; G01R 33/091; G01R 33/093; G01R 33/095; G01R 33/096; G01R 33/098; H01L 43/08; H01L 43/12; B82Y 25/00; G01D 5/24438; G01P 1/026; G01P 3/488
USPC ......................................... 324/249, 251, 252
See application file for complete search history.

(56) References Cited

U.S. PATENT DOCUMENTS

| | | | |
|---|---|---|---|
| 4,905,318 A | * | 2/1990 | Fukuda et al. ............... 338/32 H |
| 5,210,489 A | | 5/1993 | Petersen |
| 5,581,179 A | | 12/1996 | Engel et al. |
| 5,682,095 A | | 10/1997 | Mathes et al. |
| 5,998,989 A | | 12/1999 | Lohberg |
| 6,107,793 A | | 8/2000 | Yokotani et al. |
| 6,184,679 B1 | | 2/2001 | Popovic et al. |
| 6,265,865 B1 | | 7/2001 | Engel et al. |
| 6,278,269 B1 | | 8/2001 | Vig et al. |

(Continued)

FOREIGN PATENT DOCUMENTS

DE 102004063539 A1 9/2005

*Primary Examiner* — David M. Schindler
(74) *Attorney, Agent, or Firm* — Dicke, Billig & Czaja, PLLC

(57) ABSTRACT

An integrated circuit includes a leadframe, and a die having a top surface, a bottom surface, and a plurality of perimeter sides and including at least one magnetic field sensor element disposed proximate to the top surface, wherein the bottom surface is bonded to the leadframe. A molded magnetic material encapsulates the die and at least a portion of the leadframe, and provides a magnetic field substantially perpendicular to the top surface of the die. A non-magnetic material is disposed between the die and the molded magnetic material at least along perimeter sides of the die intersecting a lateral magnetic field component which is parallel to the top surface of the die.

15 Claims, 16 Drawing Sheets

(56) References Cited

U.S. PATENT DOCUMENTS

| | | |
|---|---|---|
| 6,545,462 B2 | 4/2003 | Schott et al. |
| 7,112,955 B2 | 9/2006 | Buchhold |
| 7,220,602 B2 | 5/2007 | Chung et al. |
| 7,391,203 B2 | 6/2008 | Modest |
| 2009/0140725 A1* | 6/2009 | Ausserlechner ............ 324/207.2 |
| 2009/0295381 A1* | 12/2009 | Theuss et al. ................ 324/252 |
| 2010/0201356 A1* | 8/2010 | Koller et al. ................ 324/252 |

* cited by examiner

GMR SENSOR WITHIN MOLDED MAGNETIC MATERIAL EMPLOYING NON-MAGNETIC SPACER

BACKGROUND

Magnetic field sensors, such as magneto-resistive (XMR) sensors, are used in a variety of applications for sensing the rotation of a wheel and/or shaft, such as in anti-lock braking systems, crank-shaft sensors, cam-shaft sensors, etc., and for sensing vertical and/or angular movement, for example. XMR sensors include, for example, anisotropic magneto-resistive (AMR) type sensors, tunneling magneto-resistive (TMR) sensors, giant magneto-resistive (GMR) sensors, and colossal magneto-resistive (CMR) sensors. Typically, XMR type magnetic field sensors include one or more sensor elements, such as GMR sensor elements, which are formed as part of a semiconductor die which further includes integrated circuitry for evaluating parameters of the sensor (e.g. resistance of the GMR sensor elements). In turn, the semiconductor die is typically bonded to a carrier, such as a copper leadframe, for example, to form a magnetic field sensor package.

In the case of speed and/or angle sensors, the package further includes a permanent magnet which provides a back bias magnetic field for the XMR sensor elements. The magnetic field sensor is placed in front of a magnetically permeable toothwheel, the rotation of which generates a sinusoidally varying magnetic field on the magnetic field sensor. The XMR sensor elements detect variations in the component of the magnetic field parallel to the surface of the magnetic field sensor, with the detected magnetic field variations providing information about the angular position, rotational direction, and rotational speed of the toothwheel.

Often, the permanent magnetic is a permanent magnet attached to the backside of the magnetic field sensor, such as to a surface of the leadframe opposite the semiconductor die. However, attaching a permanent magnet in this fashion has a number of disadvantages. For example, the permanent magnet has position tolerances with respect to the magnetic field sensor package since the permanent magnet is typically attached after the completion of the fabrication of the magnetic field sensor package. Also, the glue used to attach the permanent magnet to the magnetic field sensor has to be selected carefully since the sensor assembly is typically exposed to a wide temperature range (e.g., −50° C.-170° C.). Additionally, the permanent magnet is typically attached to the magnetic field sensor package by someone other than the semiconductor manufacturer who fabricated the magnetic field sensor package, so that the permanent magnet is attached to the magnetic field sensor package after the final test of the magnetic field sensor package at the semiconductor manufacturer. Furthermore, the semiconductor manufacturer typically tests the magnetic field sensor package at several temperatures. However, the permanent magnet is typically not tested at several temperatures since the thermal mass of the entire sensor assembly is usually too large to perform an economical multi-temperature test.

In attempts to overcome such disadvantages, in lieu of attaching a permanent magnet to the backside of the leadframe, the semiconductor die and leadframe of some XMR sensors are embedded within a molded magnetic material. While such an approach eliminates many of the above described problems, it has been found that the ferromagnetic material of the leadframe (e.g. copper) produces distortions in the magnetic field or flux lines at the XMR elements which results in a horizontal component of the magnetic field, parallel to the surface of the magnetic field sensor (i.e. the sensed component), having a magnitude that result the XMR sensors being in saturation, thereby rendering the sensor inoperable.

For these and other reasons, there is a need for the present invention.

SUMMARY

One embodiment provides an integrated circuit. The integrated circuit includes a leadframe, and a die having a top surface, a bottom surface, and a plurality of perimeter sides and including at least one magnetic field sensor element disposed proximate to the top surface, wherein the bottom surface is bonded to the leadframe. A molded magnetic material encapsulates the die and at least a portion of the leadframe, and provides a magnetic field substantially perpendicular to the top surface of the die. A non-magnetic material is disposed between the die and the molded magnetic material at least along perimeter sides of the die intersecting a lateral magnetic field component which is parallel to the top surface of the die.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
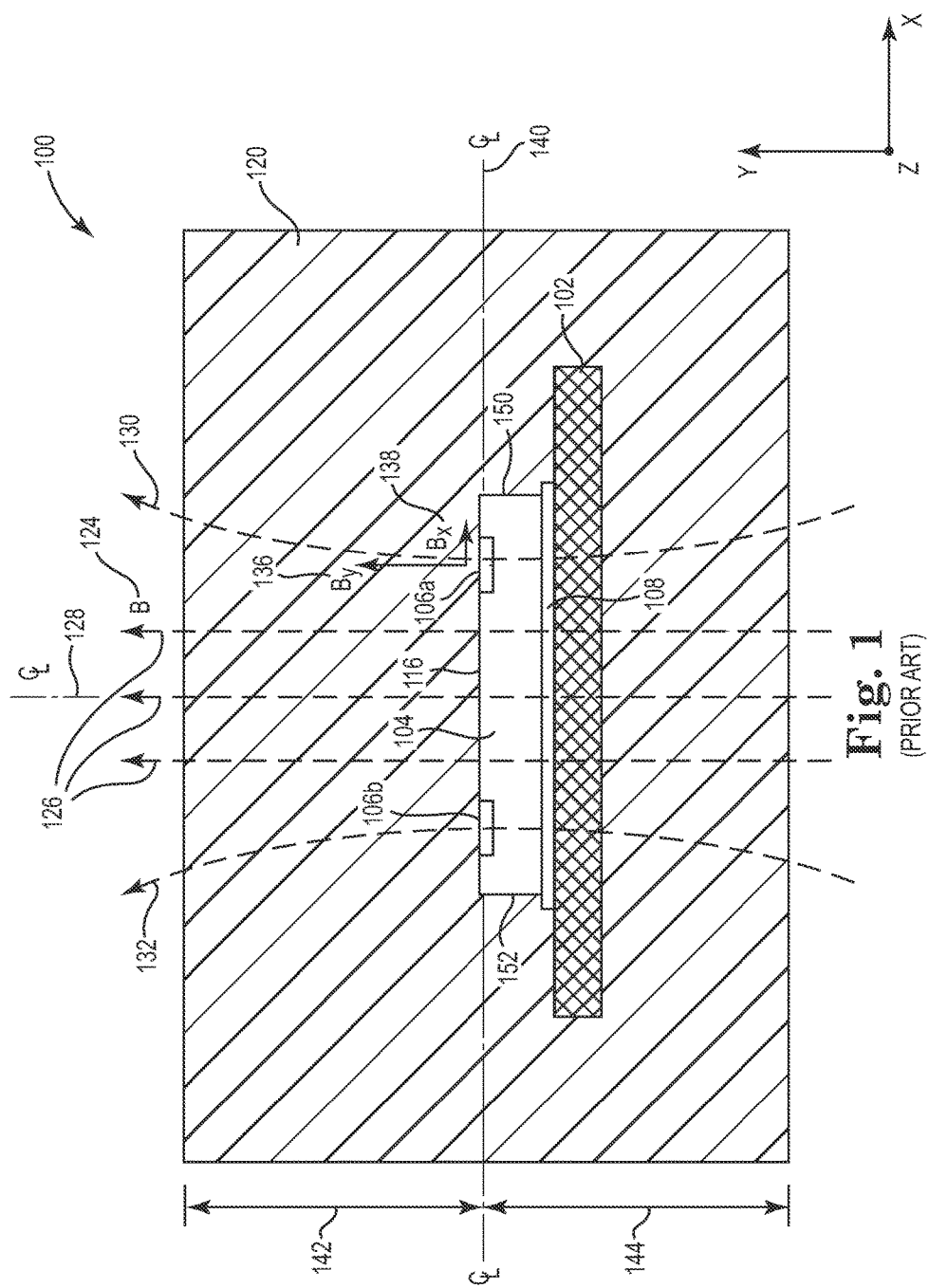
FIG. 1 illustrates a cross-sectional view of a conventional magnetic field sensor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers are applied to one another or materials are applied or deposited onto layers. It should be appreciated that any such terms as "applied" or "deposited" are meant to cover literally all kinds and techniques of applying layers onto each other. In one embodiment, they are meant to cover techniques in which layers are applied at once as a whole, in for example, laminating techniques; as well as techniques in which layers are deposited in a sequential manner, in for example, sputtering, plating, molding, chemical vapor deposition (CVD) techniques. One example for a layer to be applied is a redistribution layer (RDL) patterned in electrical connection with contacts of a chip. The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

In some embodiments the semiconductor chips are covered with an encapsulant material. The encapsulant material includes any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, a fan-out of embedded dies is fabricated. The fan-out of embedded dies is arranged in an array having the form of a wafer and is referred to as a "re-configured wafer." However, it should be appreciated that the fan-out of embedded dies is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Embodiments described herein provide a magnetic field sensor employing non-magnetic material to space a molded magnetic material providing a bias magnetic field from one or more magnetoresistive (XMR) elements so that a magnitude of a component of the bias magnetic field parallel to the one or more XMR elements is less than a threshold level, such as a saturation point of the one or more XMR elements.

Figure 2:
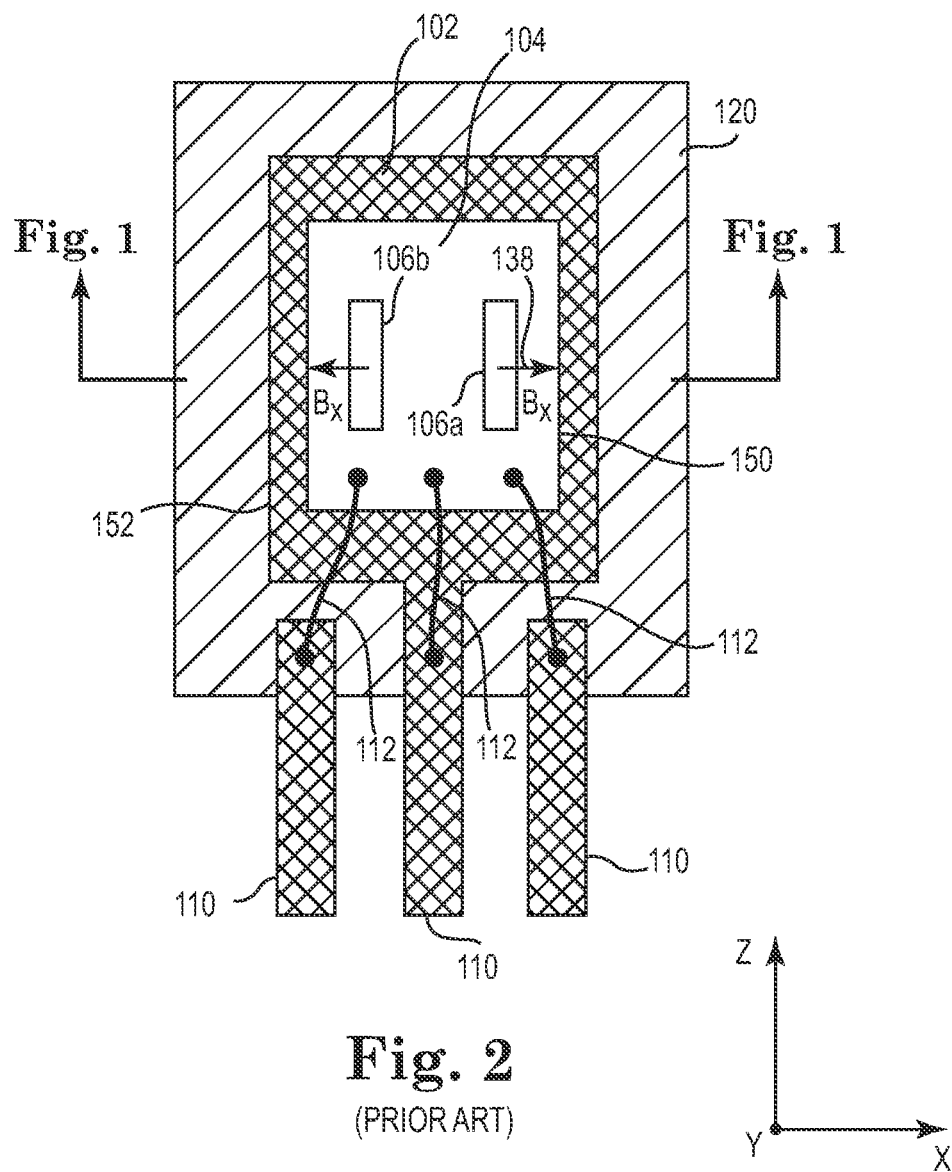
FIG. 2 is a top view illustrating portions of the magnetic field sensor of FIG. 1.

FIGS. 1 and 2 respectively illustrate cross-sectional and top views of an example of a conventional magnetic field sensor 100. Magnetic field sensor 100 includes a leadframe 102, and a magnetic field sensor die 104, including one or more XMR elements 106, such as XMR elements 106a and 106b, which is attached to leadframe 102 via a die bond material 108 (e.g. a conductive glue). Magnetic field sensor die 104 is electrically coupled to pins 110 of leadframe 102 via bond wires 112.

According to one embodiment, leadframe 102 is formed of a ferromagnetic material. According to one embodiment, XMR elements 106a and 106b, are giant magnetoresistive (GMR) elements fabricated on a top surface 116 of magnetic field sensor die 104. In other embodiments, XMR elements 106a and 106b comprise other types of XMR elements such as anisotropic magneto-resistive (AMR) elements, giant magneto-resistive (GMR) sensors, colossal magneto-resistive (CMR) elements, and tunneling magneto-resistive (TMR) elements, for example.

Leadframe 102, magnetic field sensor die 104, bond wires 112, and portions of pins 110 are encased within a molded magnetic material 120 which, as described below, is magnetized to form a plastic bonded magnet. For illustrative purposes, it is noted that only portions of molded magnetic material 120 are shown in the top view of FIG. 2.

According to one embodiment, molded magnetic material 120 includes a fine powder of a permanent magnet material, such as a hard ferrite material with Ba or Sm, a rare earth metal (e.g. NdFeB, Sm2Co17), or other suitable magnetic material, which is mixed with an epoxy binder such as a polymide (PA), poly-phenylen-sulfide (PPS), or other suitable epoxy binder. According to one embodiment, the mixture includes approximately 60% by volume of magnetic material, although other suitable percentages may be employed. The molded magnetic material may be applied using any suitable molding process including injection molding, compression molding, and transfer molding, for example.

After being applied about leadframe 102 and magnetic field sensor die 104, molded magnetic material 120 is magnetized in a direction substantially perpendicular to top surface 116 of field sensor die 104. The magnetization of molded magnetic material 120 results in molded magnetic material 120 providing a bias magnetic field B 124 having magnetic field or flux lines 126 which are substantially perpendicular to top surface 116 when proximate to a centerline 128 of molded magnetic material 120, but which diverge in the positive and negative x-directions on the right and left sides of centerline 128, as respectively illustrated by flux lines 130 and 132.

As a result, the magnetic field at GMR elements 106a and 106b has both a y- or vertical component, By 136, which is perpendicular to top surface 116, and an x- or lateral component, Bx 138, which is parallel to top surface 116. The vertical components By 136 are substantially equal at GMR elements 106a and 106b. Similarly, the magnitudes of lateral components Bx 138 at GMR elements 106a and 106b are substantially equal, but the component Bx 138 at GMR element 106a is positive while the component Bx 138 at GMR element 106b is negative.

Molded magnetic material 120 is applied such that a thickness 142 above a centerline 140 of GMR elements 106a and 106b is substantially the same as a thickness 144 below centerline 140. By having molded magnetic material 120 disposed equally above and below centerline 140, the vertical component By 136 of magnetic field B 124 is substantially uniform, and the magnetic field or flux lines, such as illustrated by flux lines 126, pass through magnetic sensor die 104 in a more perpendicular fashion relative to top surface 116. The more perpendicular the flux lines, the more the lateral component Bx 138 of magnetic field B 124 at GMR elements 106a, 106b (i.e. the vector component of magnetic field B 124 which is parallel to top surface 116) will be reduced. Reducing the magnitude of lateral component Bx 138 helps to prevent saturation of GMR elements 106a, 106b and helps to insure the proper functioning and operation of GMR elements 106a, 106b and magnetic field sensor 100.

However, regardless of the care taken to apply molded magnetic material 120 in an equal fashion above and below GMR sensor elements 106a, 106b, ferromagnetic leadframe 102 causes distortions in magnetic field B 124, especially along the perimeter sides of field sensor die 104. Of most concern are magnetic field distortions along perimeter sides of magnetic field sensor die 104 which are perpendicular to the lateral component Bx 138 of magnetic field B 124, such as sides 150 and 152, which distort magnetic field B 124 at GMR elements 106a, 106b and increases the magnitude of lateral component Bx 138. If the magnitude of lateral component Bx 138 becomes too large, it can cause the saturation of GMR elements 106a and 106b and render magnetic field sensor 100 inoperable.

Figure 3:
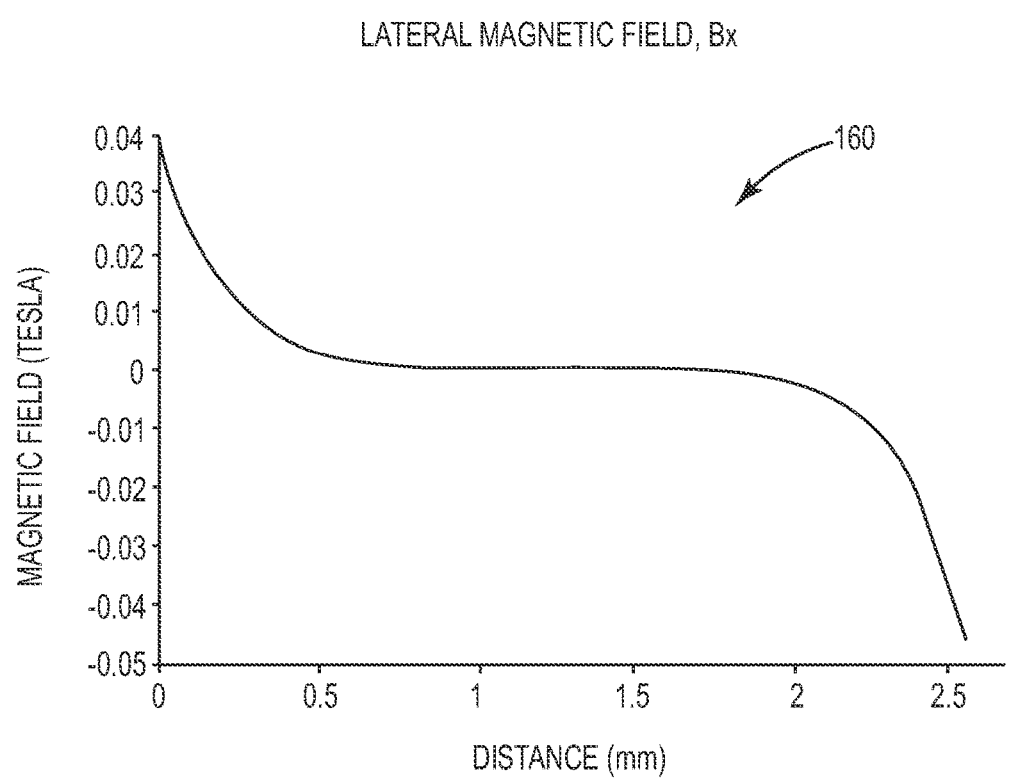
FIG. 3 is a graph illustrating a simulation of the magnitude of lateral magnetic field component of the conventional magnetic field sensor of FIGS. 1 and 2.

FIG. 3 is a graph 160 illustrating a simulation of the magnitude of lateral component Bx 138 across top surface 116 of magnetic field sensor die 104 of conventional magnetic field sensor 100 of FIGS. 1 and 2. According to graph 160, GMR sensor 106b is located approximately at 0 mm along the x-axis, and GMR sensor 106a is located approximately at 2.5 mm. According to the simulation of FIG. 3, the range of the magnitude of the lateral component Bx 138 of magnetic field B 124 across magnetic field sensor die 104 is approximately +/−40 milli-Tesla (mT). Such a range is well above the allowed range of +/−5 mT of many GMR sensing elements and will result in the saturation of GMR sensing elements 106a and 106b.

Figure 4:
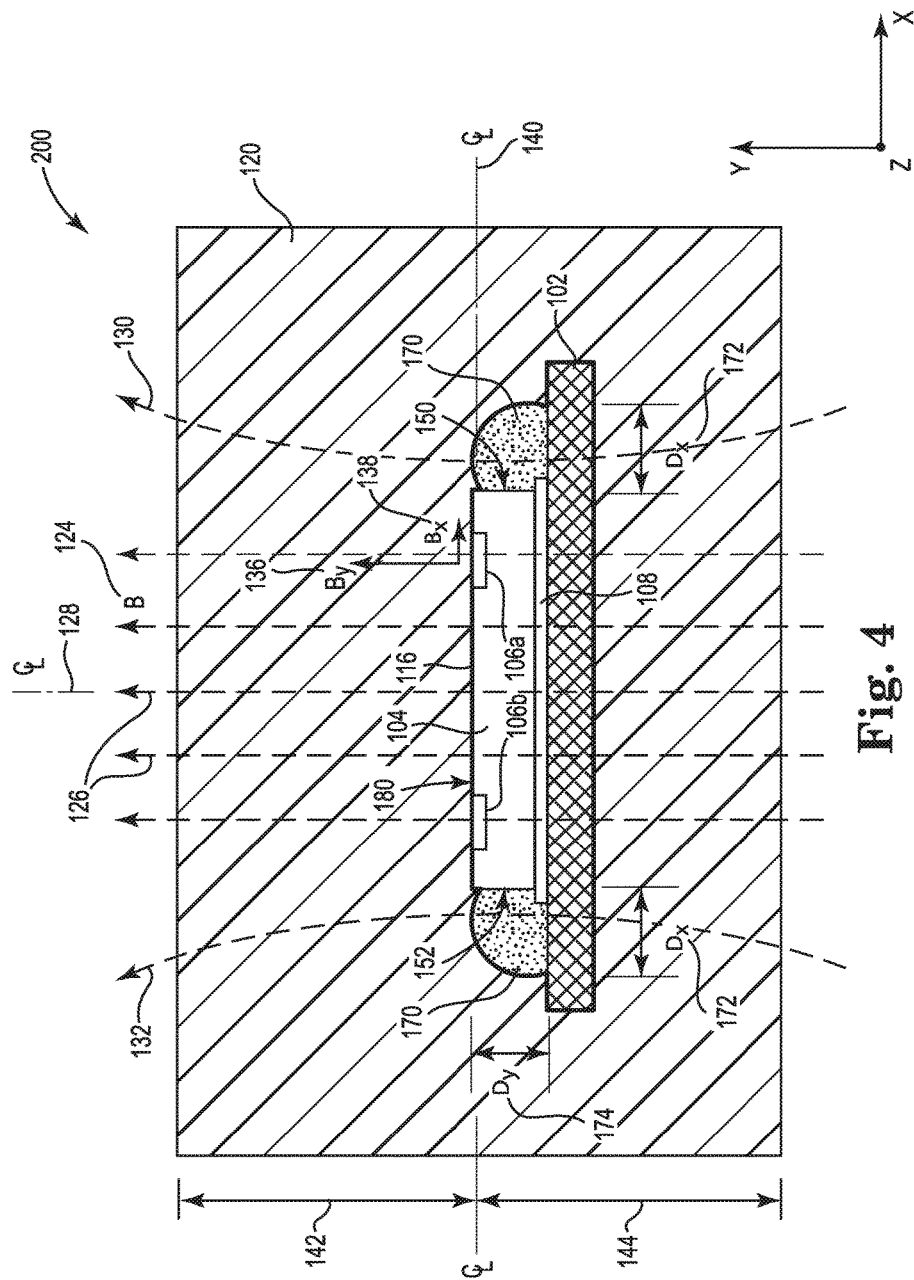
FIG. 4 illustrates a cross-sectional view of one embodiment of a magnetic field sensor.
Figure 5:
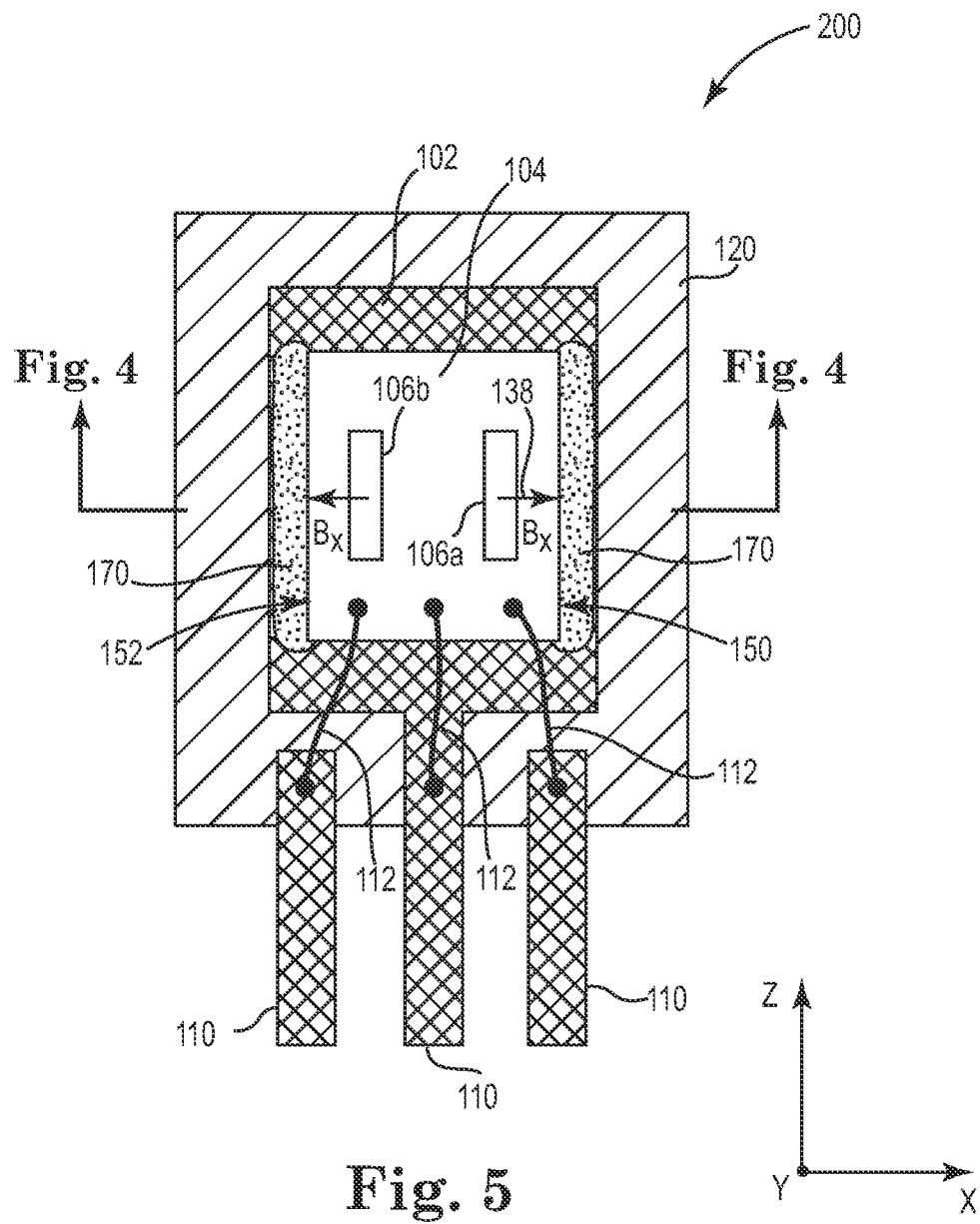
FIG. 5 is a top view illustrating portions of the magnetic field sensor of FIG. 4.

FIGS. 4 and 5 respectively illustrate cross-sectional and top views of one embodiment of magnetic field sensor 200 employing non-magnetic spacers according to the present disclosure. According to one embodiment, a non-magnetic material 170 is disposed on leadframe 102, along at least a portion of the perimeter sides of magnetic field sensor die 104, so as to space molded magnetic material 120 away from perimeter sides of magnetic field sensor die 104. According to one embodiment, as illustrated by FIGS. 4 and 5, non-magnetic material 170 is disposed along the sides 150 and 152 of magnetic field sensor die 104 which are perpendicular to or intersect the vector components of bias magnetic field B 124 parallel to top surface 116 (i.e., lateral component Bx 138 in FIG. 1). For illustrative purposes, it is noted that only portions of molded magnetic material 120 are shown in the top view of FIG. 5.

Employing non-magnetic material 170 to space or shift molded magnetic material away from magnetic field sensor die 104 has the effect of shifting the magnetic field lines of magnetic field B 124 toward the sides of magnetic field sensor die 104. As a result, divergent flux lines, such as flux lines 132 and 134, are shifted away from magnetic field sensor die 104, thereby reducing the lateral component Bx 138 across surface 116. According to embodiments described herein, non-magnetic material 170 can be configured to reduce the magnitude of lateral component Bx 138 to a level that ensures proper operation of magnetic field sensor 200. According to one embodiment, non-magnetic material 170 has a dimension Dx 172 which spaces molded magnetic material 120 from GMR elements 106 in the direction of lateral component Bx 138 by an amount which maintains the magnitude of lateral component Bx 138 across top surface 116 of magnetic field sensor die 104 to a level at least below a saturation point of GMR elements 106a, 106b.

The required dimension Dx 172 of non-magnetic material 170 may vary depending upon a variety of factors including the strength of magnetic field B 124, the physical size of the magnet formed by molded magnetic material 120, and the design and configuration of GMR elements 106a, 106b. According to one embodiment, non-magnetic material 170 is disposed in a symmetrical fashion about centerline 128 of magnetic field sensor die 104. According to one embodiment, non-magnetic material 170 has a dimension Dy 174 so as to approximately align with top surface 116 of magnetic field sensor die 104.

Non-magnetic material 170 may comprise any suitable non-magnetic material. Examples of materials which may be suitable for use as non-magnetic material 170 include silicon, glass, ceramic, polyamide plastic, polyphenylenesulfid plastic, cross-linked silicon glues, hardened novalak materials, polyimides, hardened Cresol materials, polybenzoxazoles, and epoxy based materials. According to one embodiment, non-magnetic material 170 comprises silicon, which is selected for its temperature stability characteristics.

Although the magnetic particles within molded magnetic material 120 are bonded with a polymer material, molded magnetic material 120 is still electrically conductive so that the magnetic particles need to be separated or isolated from the surfaces of leadframe 102, magnetic field sensor die 104, bonding wires 112, and non-magnetic material 170 from molded magnetic material 120. According to one embodiment, prior to application of molded magnetic material 120, an isolation layer 180 is applied so as to cover and isolate leadframe 102, magnetic field sensor die 104, bonding wires 112, and non-magnetic material 170 from molded magnetic material 120. According to one embodiment, isolation layer 180 is an isolating resin material. According to one embodiment, isolation layer 180 is a SiOx layer deposited over the surfaces such as via plasma deposition processes, for example. According to one embodiment, isolation layer 180 is applied prior to application of non-magnetic material 170. According to one embodiment, not illustrated herein, as an alternative to applying isolation layer 180, the magnetic particles within molded magnetic material 120 are coated with an isolating material, such as silane, for example, to electrically isolate the magnetic particles from the device surfaces. It is noted that, for ease of illustration, isolation layer 180 is not shown in FIG. 5.

Figure 6:
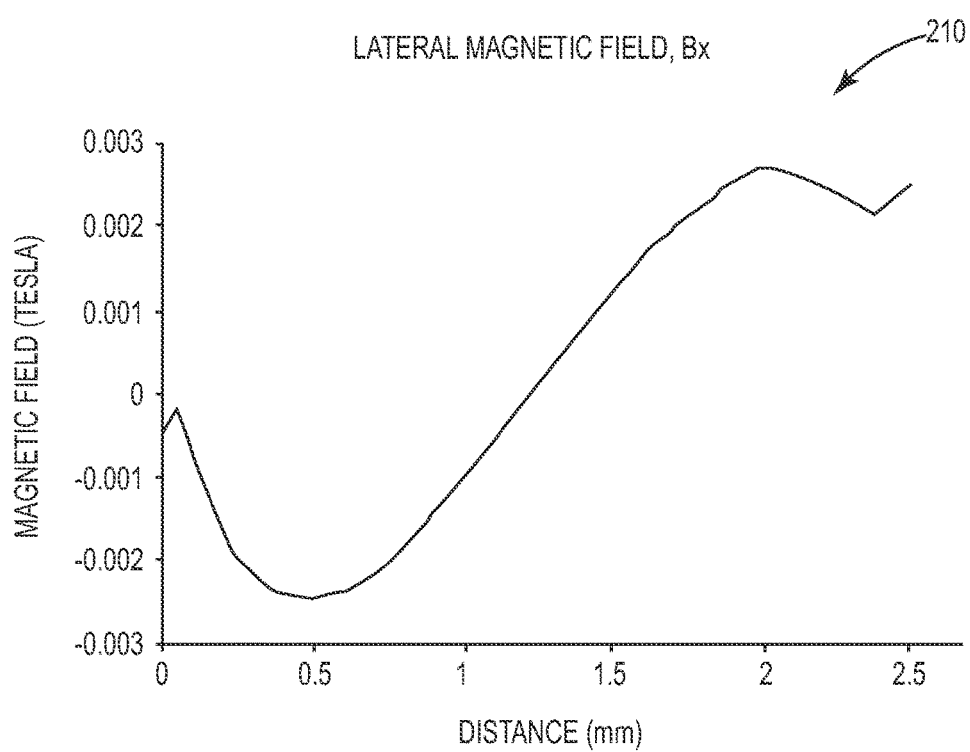
FIG. 6 is a graph illustrating a simulation of the magnitude of lateral magnetic field component of the magnetic field sensor according to the embodiment of FIGS. 4 and 5.

FIG. 6 is a graph 210 of a simulation of the magnitude of lateral component Bx 138 of magnetic field B 124 across magnetic field sensor die 104 of magnetic field sensor 200 of FIGS. 4 and 5 employing non-magnetic material 170 according to present disclosure. According to graph 210, GMR sensor 106b is located at approximately 0 mm along the x-axis, and GMR sensor 106a is located at approximately 2.5 mm. According to the simulation of FIG. 3, the range of the magnitude of the lateral component Bx 138 of magnetic field B 124 across magnetic field sensor die 104 is approximately +/−3 milli-Tesla (mT), which is less than the maximum allowed range of +/−5 mT of many GMR sensing elements. As such, magnetic field sensor 100 employing non-magnetic material 170 according to the present disclosure enables magnetic field sensor 200 to function properly, whereas GMR sensor elements 106a, 106b of magnetic field sensor 100 according to the conventional implementation of FIGS. 1 and 2 are in saturation and, thus, inoperable.

According to one embodiment, non-magnetic material 170 can be dispensed and hardened during an assembly process, such as in the form of silicon or epoxy glues, for example. According to such an embodiment, non-magnetic material 170 hardens into a final "globtop" or "globetop" shape, such as illustrated above by the embodiment of FIGS. 4 and 5. However, according to other embodiments, non-magnetic material 170 may be pre-shaped and applied in a final form to leadframe 102, such as through use of adhesives, for example.

Figure 7:
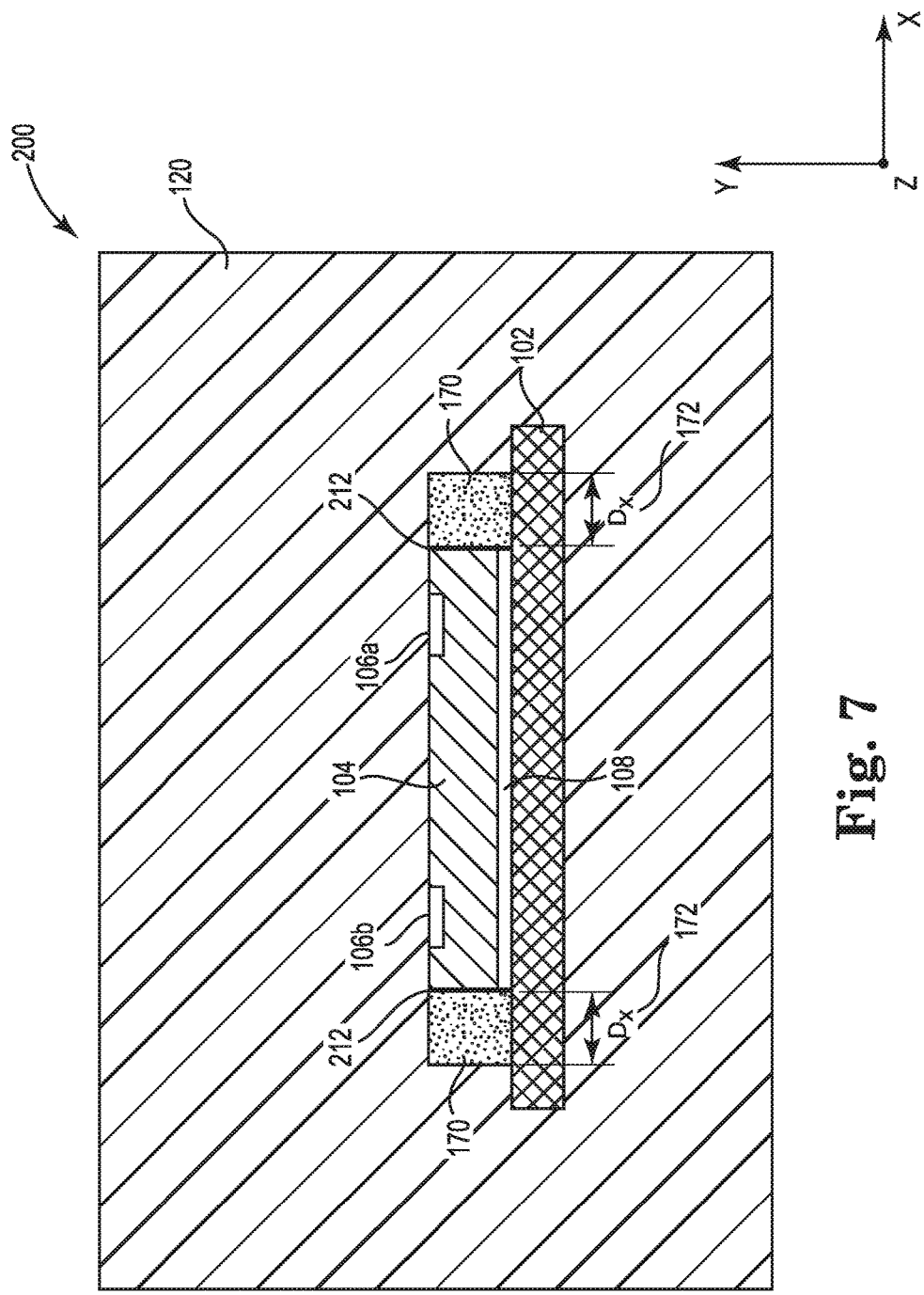
FIG. 7 illustrates a cross-sectional view of another embodiment of a magnetic field sensor.

FIG. 7 illustrates magnetic field sensor 200 according to the present disclosure where non-magnetic spacers 170 are pre-shaped into a final rectangular form and applied to leadframe 102 so as to extend along sides 150 and 152 of magnetic field sensor die 104 which are perpendicular to lateral magnetic field component Bx 138. According to one embodiment, gaps 212 between non-magnetic spacers 170 and sides 150 and 152 are filled, such as with a non-conductive glue, for example.

Figure 8:
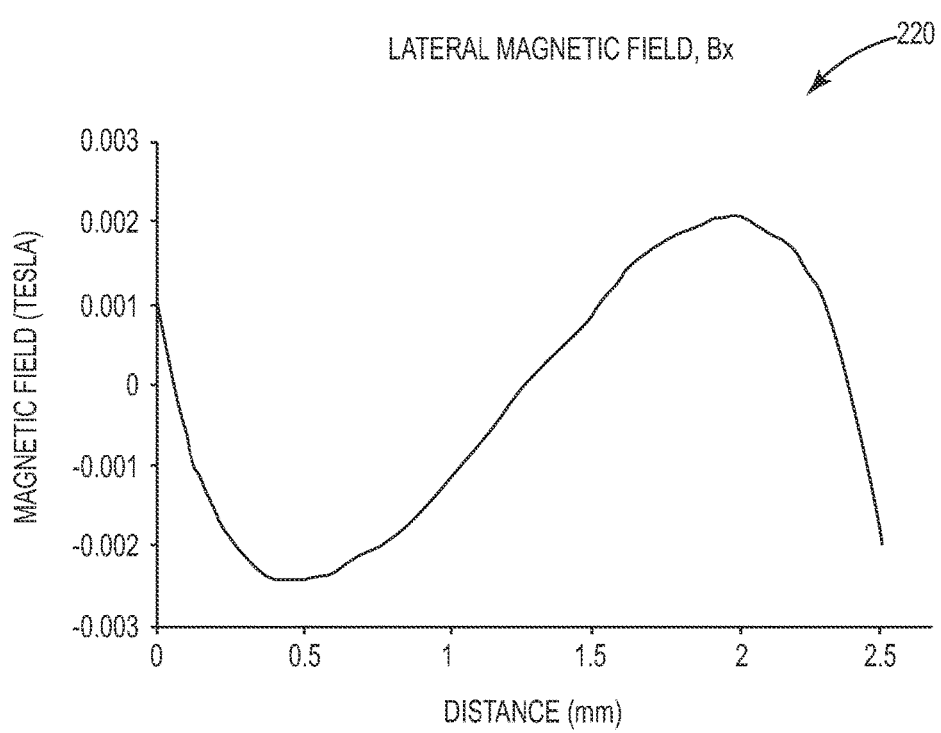
FIG. 8 is a graph illustrating a simulation of the magnitude of lateral magnetic field component of the magnetic field sensor according to the embodiment of FIG. 7.

FIG. 8 is a graph 220 of a simulation of the magnitude of lateral component Bx 138 of magnetic field B 124 across top surface 116 of magnetic field sensor die 104 of magnetic field sensor 200 of FIG. 7. According to graph 220, GMR sensor 106b is located at approximately 0 mm and GMR sensor 106a is located at approximately 2.5 mm along the x-axis. According to the simulation of FIG. 8, the range of the magnitude of the lateral component Bx 138 of magnetic field B 124 across magnetic field sensor die 104 is approximately +/−2 milli-Tesla (mT), again less than the maximum allowed range of +/−5 mT of many GMR sensing elements.

Although primarily described above as being disposed along only those perimeter sides 150 and 152 of magnetic field sensor die 104 which are perpendicular to or intersect lateral component Bx 138 of magnetic field B 124, according to other embodiment, non-magnetic material 170 may be applied about magnetic field sensor die 104 in other configurations as well. For example, according to one embodiment (not explicitly illustrated herein), non-magnetic material 170 may be disposed, in a fashion similar to that illustrated by FIGS. 4 and 5, about all perimeter sides of magnetic field sensor die 104 rather than just along perimeter sides 150 and 152.

Figure 9:
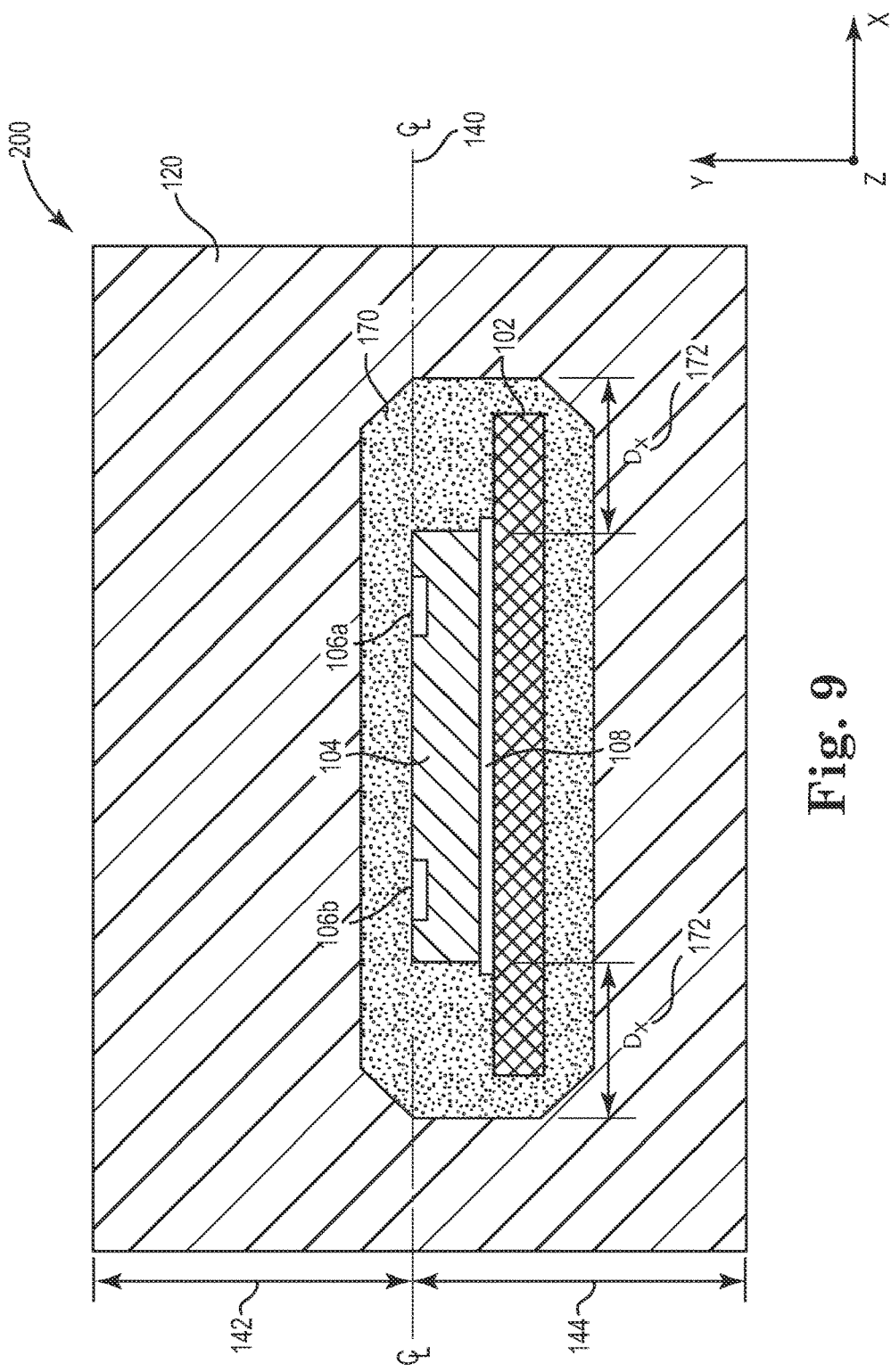
FIG. 9 illustrates a cross-sectional view of another embodiment of a magnetic field sensor.
Figure 10:
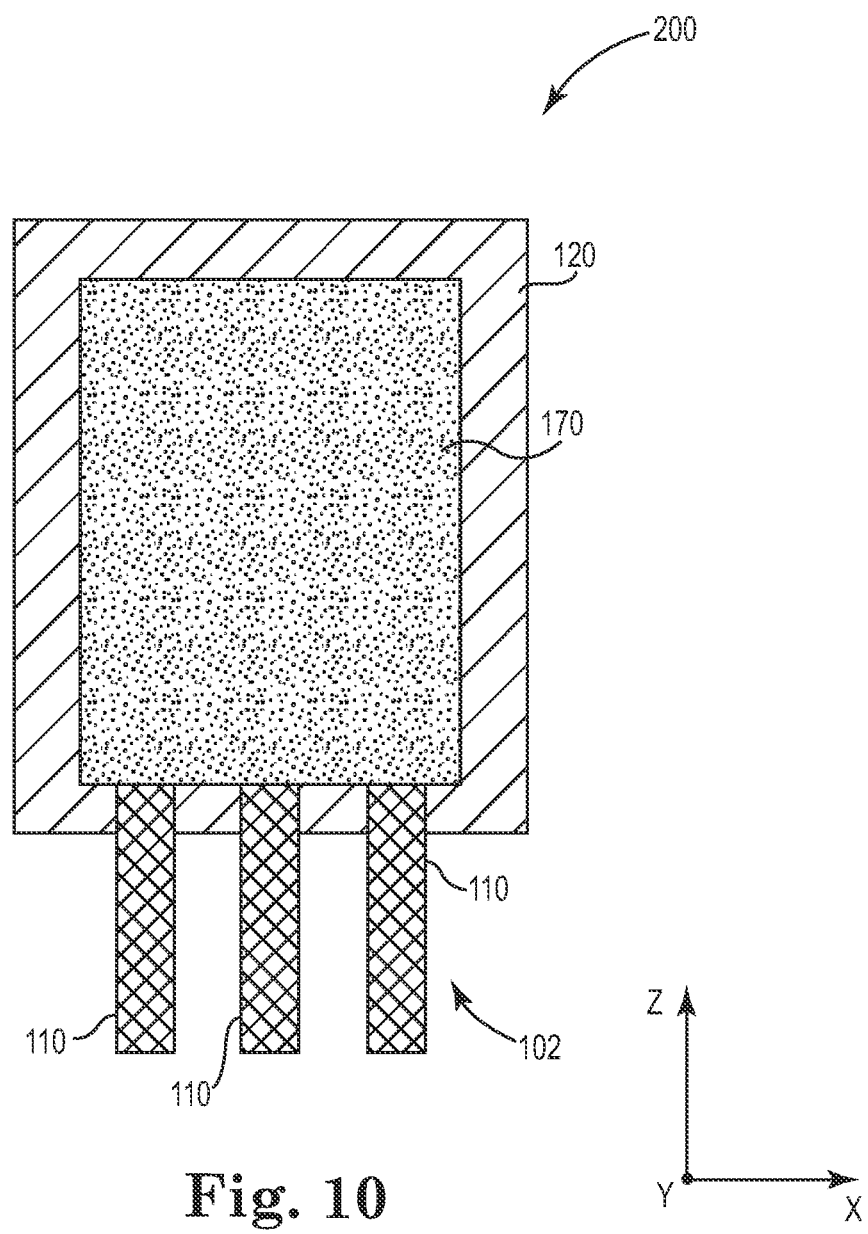
FIG. 10 is a top view illustrating portions of the magnetic field sensor of FIG. 9.

FIGS. 9 and 10 respectively illustrate cross-sectional and top views of magnetic field sensor 200, according to one embodiment, where non-magnetic material completely encases magnetic field sensor die 104 and leadframe 102, except for portion of pins 110. Similar to that described above, according to one embodiment, non-magnetic material 170 is molded about leadframe 102 and magnetic field sensor die 104 such that a thickness 142 of molded magnetic material 120 above centerline 140 of GMR elements 106a, 106b is substantially the same as a thickness 144 of molded magnetic material 120 below centerline 140. For illustrative purposes, it is noted that only portions of molded magnetic material 120 are shown in the top view of FIG. 10.

Figure 11:
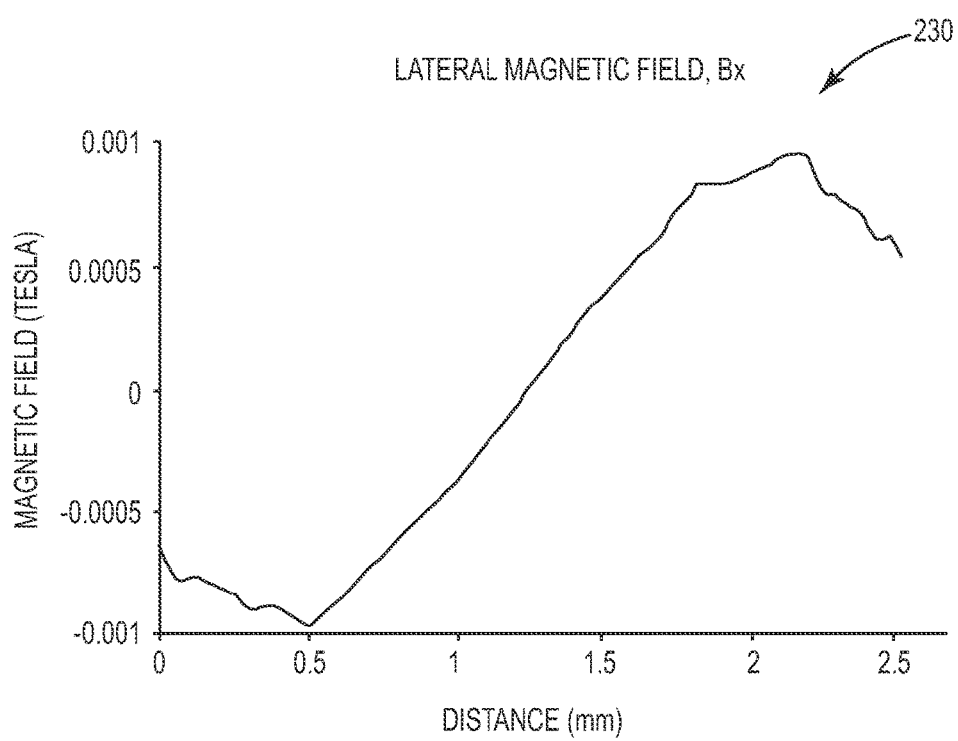
FIG. 11 is a graph illustrating a simulation of the magnitude of lateral magnetic field component of the magnetic field sensor according to the embodiment of FIGS. 9 and 10.

FIG. 11 is a graph 230 of a simulation of the magnitude of lateral component Bx 138 of magnetic field B 124 across top surface 116 of magnetic field sensor die 104 of magnetic field sensor 200 of FIGS. 9 and 10. According to graph 230, GMR sensor 106b is located at approximately 0 mm and GMR sensor 106a is located at approximately 2.5 mm along the x-axis. According to the simulation of FIG. 11, the range of the magnitude of the lateral component Bx 138 of magnetic field B 124 across magnetic field sensor die 104 is approximately +/−1 milli-Tesla (mT), again less than the maximum allowed range of +/−5 mT of many GMR sensing elements.

Figure 12A:
FIGS. 12A-12D are diagrams illustrating a process of fabricating a magnetic field sensor according to one embodiment.

FIGS. 12A through 12E illustrate a method of fabricating magnetic field sensor 200 according to one embodiment of the present disclosure, in particular, magnetic field sensor 200 illustrated above by FIG. 7. With reference to FIG. 12A, the method begins with bonding of hardened and pre-formed non-magnetic material 170 to leadframe 120, such as via a glue 232. According to one embodiment, similar to that illustrated by FIG. 7, the non-magnetic material 170 into a pair of rectangular shapes which are substantially parallel with one another and spaced apart by a distance incrementally greater than a width of magnetic field sensor die 104.

Figure 12B:
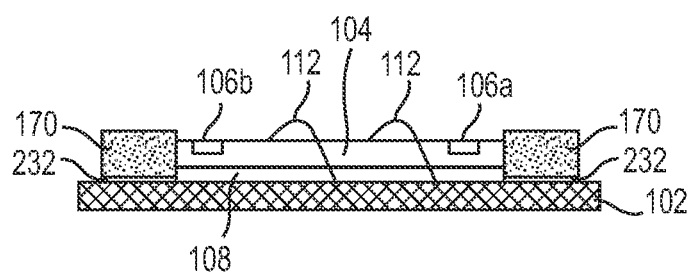

At FIG. 12B, magnetic field sensor die 104 is bonded via a bottom surface to leadframe 104 between the pair of rectangular shapes of non-magnetic material 170 using glue 108. According to one embodiment, any gaps between magnetic field sensor die 104 and non-magnetic material 170 are filled with glue, similar to that illustrated by FIG. 7. Bonding wires 112 are then bonded between magnetic field sensor die 104 and leadframe 102, similar to that illustrated by FIG. 5.

Figure 12C:
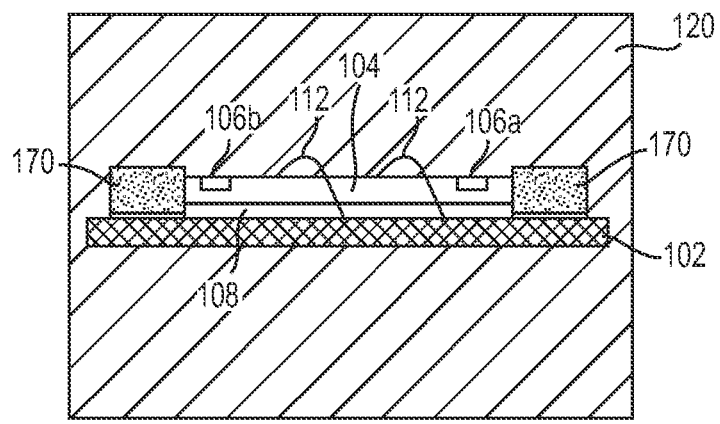
Figure 12D:
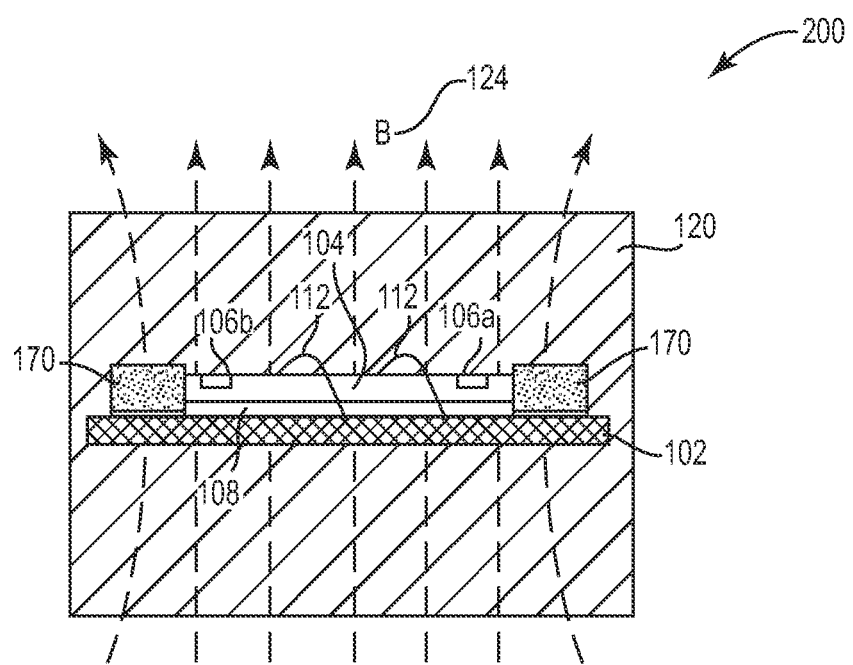

At FIG. 12C, magnetic material 120 is applied so as to encase magnetic field sensor die 104, non-magnetic material 170, and at least a portion of leadframe 102. Magnetic material 120 may be applied using any suitable molding process, such as injection molding, for example. At FIG.

12D, molded magnetic material is magnetized to form magnetic field B 124 which is substantially perpendicular to top surface 116 of magnetic field sensor die 104 and having a lateral magnetic field component which is parallel to top surface 116 and in a direction which intersects non-magnetic material 170.

Figure 13:
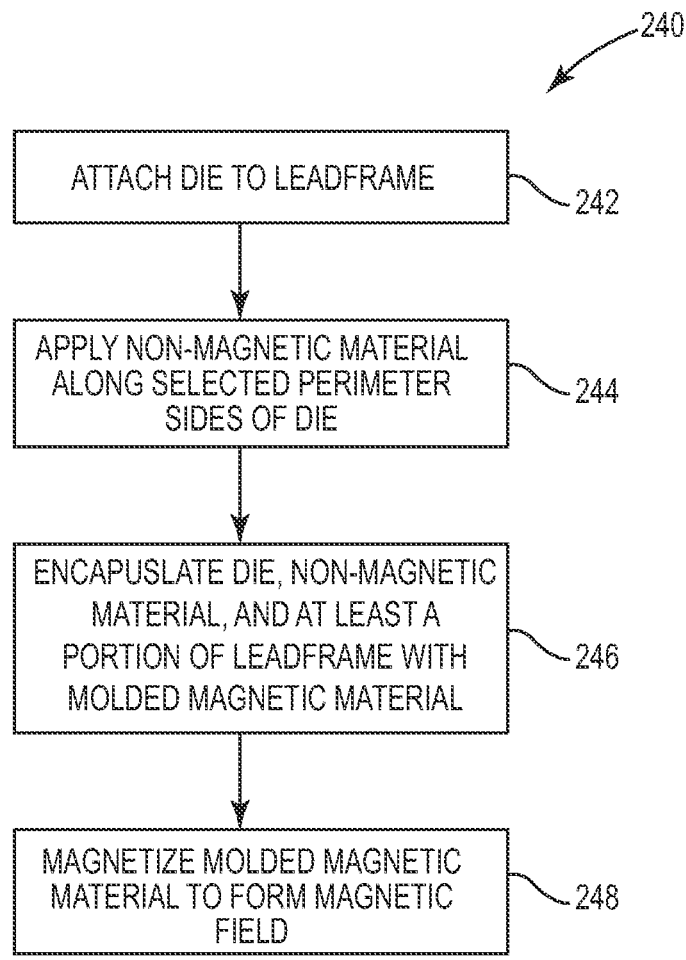
FIG. 13 is a flow diagram illustrating a process of fabricating a magnetic field sensor according to one embodiment.

FIG. 13 is a flow diagram generally illustrating one embodiment of a process 240 for fabricating a magnetic field sensor according to the present disclosure. Process 240 begins at 242 with the attachment of a magnetic field sensor die to a leadframe such as bonding field sensor die 104 to leadframe 102 via glue 108 as illustrated by FIG. 4. Bonding wires, such as bonding wires 112, are also bonded between magnetic field sensor die 104 and leadframe 102, such as leadframe pins 110 as illustrated by FIG. 5.

At 244, non-magnetic material 170 is disposed at least along selected perimeter sides of magnetic field sensor 104, such as illustrated by FIG. 4. According to one embodiment, as described above, non-magnetic material 170 is first applied in a non-hardened form and then hardened via a hardening process. According to one embodiment, as illustrated by FIGS. 9 and 10, in lieu of being disposed along only selected perimeter sides, non-magnetic material 170 is molded so as to encase magnetic field sensor die 104 and at least a portion of leadframe 102.

At 246, magnetic material 120, using any suitable molding technique, is molded so as to encase magnetic field sensor die 104, non-magnetic material 170, and at all but the pins 110 of leadframe 102. At 248, molded magnetic material 120 is magnetized so as to provide a magnetic field which is substantially perpendicular to a top surface of magnetic field sensor die 104 and so that any lateral component thereof is in a direction toward perimeter sides of magnetic field sensor die 104 along which non-magnetic material 170 has been disposed, such as illustrated by FIGS. 4 and 5. As described above, non-magnetic material 170 is applied so as to have a dimension from a perimeter side of magnetic field sensor die 104 to molded magnetic material 170 in the direction of the lateral magnetic field component which results in a magnitude of the lateral magnetic field component across the top of magnetic field sensor die 104 being less than a saturation level of the magnetoresistive elements disposed thereon.

Figure 14:
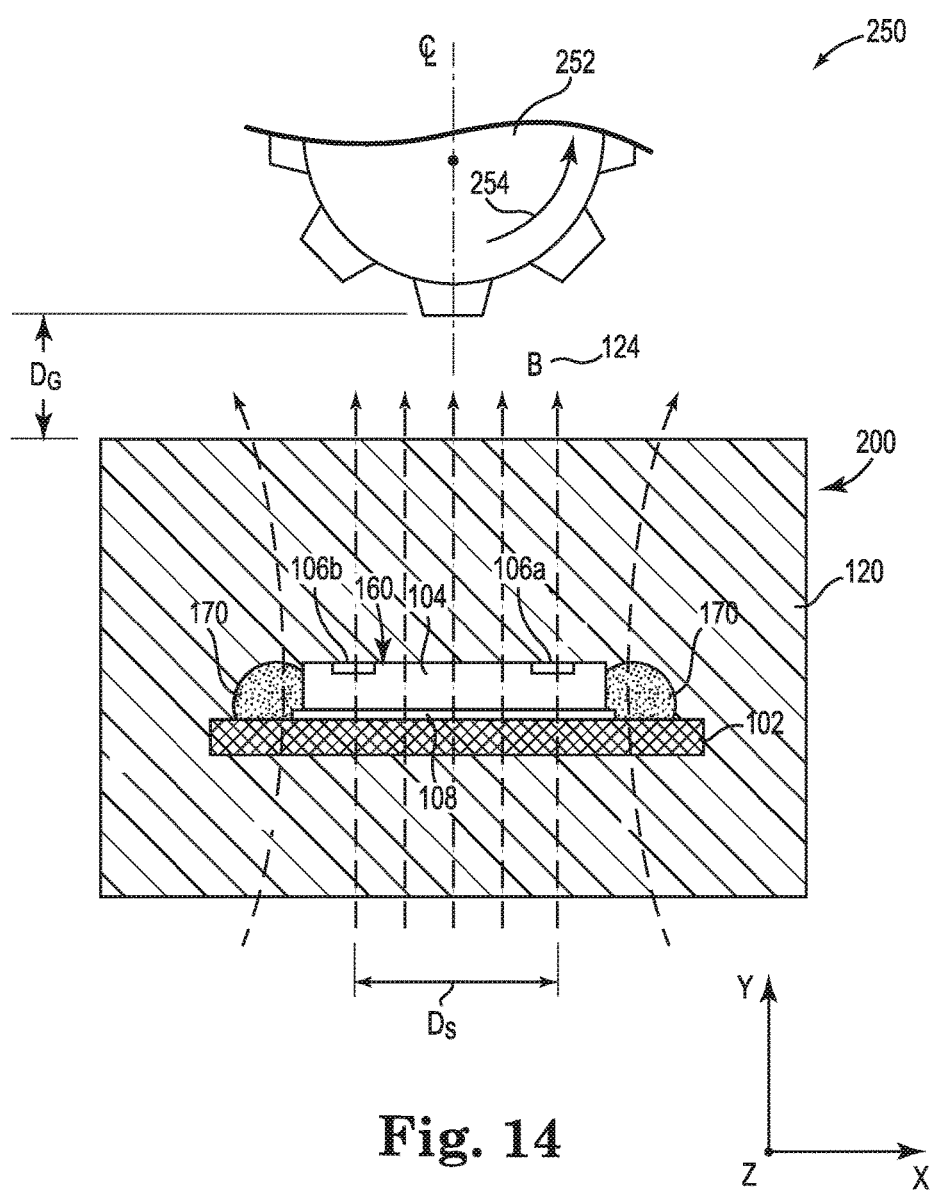
FIG. 14 is a diagram generally illustrating a speed sensor employing a magnetic field sensor according to one embodiment.

According to one embodiment, as illustrated by FIG. 14, magnetic field sensor 200 is employed as part of speed sensor 250 for sensing the speed of a ferromagnetic toothed wheel 252. Magnetic field sensor 200 is separated from toothed wheel 252 by an air-gap distance, $D_G$, with GMR sensing elements 106 separated by a distance $D_S$ and being centered on a centerline C of toothed wheel 252. As described above, molded magnetic material 120 provides bias magnetic field B 124 in the y-direction, perpendicular to surface 116 of magnetic field sensor die 104, with GMR sensing elements 106 being sensitive to changes in the x-direction (lateral direction) of bias magnetic field B 124.

In operation, as toothed wheel 252 rotates, as indicated at 254, the teeth pass in front of GMR sensing elements 106 and generate sinusoidal magnetic field variations in lateral magnetic field B 138 which are detected by GMR sensing elements 106. The detected magnetic field variations provide information about the angular position and rotational speed of toothed wheel 252.

Figure 15:
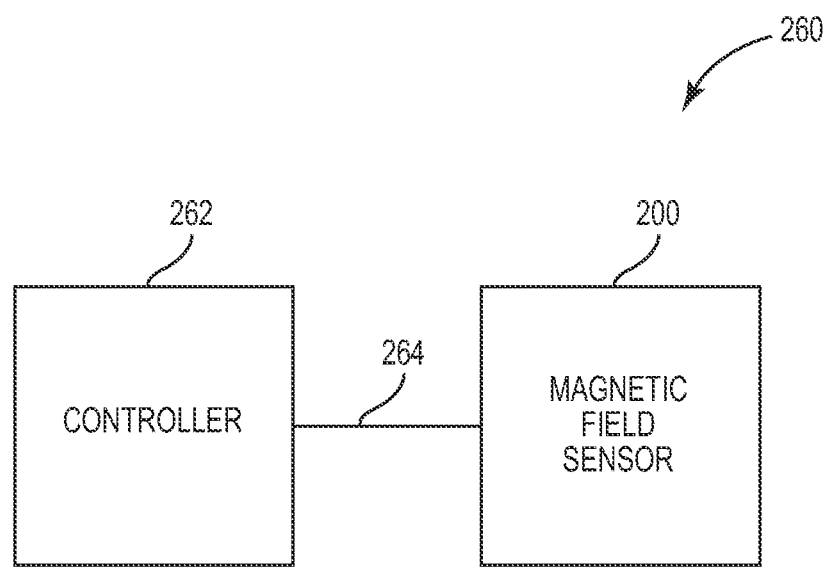
FIG. 15 is a block diagram illustrating one embodiment of a system employing a magnetic field sensor.

According to one embodiment, as illustrated by FIG. 15, magnetic field sensor 200 may be employed as part of a system 260, including a controller 262, with magnetic field sensor 200, based on the principles described above with respect to FIG. 7, being used to sense the rotation of a wheel and/or shaft, such as in an anti-lock braking system, crank shaft sensor, and cam shaft sensor of an automobile, for example. Controller 262 is electrically coupled to magnetic field sensor 200 via a signal path 264. Controller 262 includes a microprocessor, microcontroller, or other suitable logic circuitry for controlling operation of magnetic field sensor 200 and for determining rotational speed and position information from the magnetic field variations detected by GMR sensing elements 106. Although not illustrated, it is noted that, according to one embodiment, portions and/or all of controller 262 may formed as integrated circuits as part of magnetic field sensor die 104.

By employing non-magnetic material 170 to space molded magnetic material 120 away from at least selected perimeter sides of magnetic field sensor die 104 to reduce and/or eliminate magnetic field distortions caused by ferromagnetic leadframe 102, as described above, the physical dimensions of molded magnetic material 120 may be reduced while still providing a magnetic field having a lateral component which is below a saturation level of the magnetoresistive sensing elements. As such, the size, weight, and cost of magnetic field sensor 200 can be reduced relative to conventional sensors.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a leadframe;
   a die having a top surface, a bottom surface, and a plurality of perimeter sides and including at least one magnetoresistive magnetic field sensor element disposed proximate to the top surface, wherein the bottom surface is bonded to the leadframe;
   a molded magnetic material encapsulating the die and at least a portion of the leadframe, and providing a magnetic field having a vertical component perpendicular to the top surface of the die; and
   a first non-magnetic material disposed between the die and the molded magnetic material only along the plurality of perimeter sides of the die, so that the first non-magnetic material spaces the molded magnetic material away from the plurality of perimeter sides of the die such that a magnitude of a lateral magnetic field component across the top surface of the die is less than a saturation point of the at least one magnetic field sensor.

2. The integrated circuit of claim 1, wherein the first non-magnetic material is disposed at least along perimeter sides which are perpendicular to the lateral magnetic field component.

3. The integrated circuit of claim 1, wherein the first non-magnetic material is disposed between the die and the molded magnetic material along only two perimeter sides of the die.

4. The integrated circuit of claim 1, wherein the first non-magnetic material and the molded magnetic material are disposed in a substantially symmetrical fashion about a centerline of the die which is perpendicular to the lateral magnetic field component.

5. The integrated circuit of claim 1, wherein the first non-magnetic material comprises silicon.

6. The integrated circuit of claim 1, wherein the first non-magnetic material comprises one selected from a group consisting of silicon, glass, ceramic, polyamide plastic, polyphenylenesulfid plastic, cross-linked silicon glues, hardened novalak materials, polyimides, hardened Cresol materials, polybenzoxazoles, and epoxy based materials.

7. The integrated circuit of claim 1, including a second non-magnetic material defined as an isolation layer coating the leadframe, the die, and the first non-magnetic material which electrically isolates the leadframe, the die, and the first non-magnetic material from the molded magnetic material.

8. The integrated circuit of claim 1, wherein the non-magnetic material has a dimension that is further based on dimensions of the molded magnetic material.

9. The integrated circuit of claim 1, wherein the non-magnetic material has a dimension that is further based on a configuration of the at least one magnetoresistive magnetic field sensor element.

10. The integrated circuit of claim 1, wherein the first non-magnetic material is pre-shaped.

11. The integrated circuit of claim 1, wherein the first non-magnetic material does not extend above the top surface of the die.

12. A method for fabricating a semiconductor circuit comprising:
bonding at least a pair of pre-formed strips of non-magnetic material to a leadframe, the pre-formed strips being spaced apart and parallel to one another;
bonding a die to the leadframe between the pre-formed strips, the die having at least a pair of magnetoresistive sensor elements disposed on a top surface and spaced apart from one another along an axis, the die positioned such that the axis intersect the pair of pre-formed strips;
applying an isolation layer over the die, leadframe, and pre-formed strips;
encapsulating the die, the pre-formed strips, and at least a portion of the leadframe in a molded magnetic material, the isolation layer electrically isolating the die, leadframe, and pre-formed strips from the molded magnetic material; and
magnetizing the molded magnetic material to form a magnetic field substantially perpendicular to the top surface of the die and such that any magnetic field component parallel to the top surface is parallel to the axis.

13. The method of claim 12, wherein each of the pre-formed strips has a dimension from a perimeter side to the molded magnetic material that spaces the molded magnetic material away from the die such that a magnitude of the magnetic field component parallel to the top surface is less than a saturation level of the magnetoresistive sensor elements.

14. An integrated circuit comprising:
a leadframe;
a die having a top surface, a bottom surface, and a plurality of perimeter sides and including at least one magnetoresistive magnetic field sensor element disposed proximate to the top surface, wherein the bottom surface is bonded to the leadframe;
a molded magnetic material encapsulating the die and at least a portion of the leadframe; and
a first non-magnetic material disposed between the die and the molded magnetic material only along the plurality of perimeter sides of the die, so that the first non-magnetic material spaces the molded magnetic material away from the plurality of perimeter sides of the die, and where the first non-magnetic material only extends along the plurality of perimeter sides between the bottom surface and the top surface.

15. The integrated circuit of claim 14, comprising a second non-magnetic material in the form of an insulating layer coating the die, the first non-magnetic material and at least a portion of the leadframe.

* * * * *